United States Patent
O'Neil

(10) Patent No.: US 11,362,508 B1
(45) Date of Patent: Jun. 14, 2022

(54) PARTIAL RMS BASED OVER-CURRENT DETECTION FOR VDT EXCITATION

(71) Applicant: Hamilton Sundstrand Corporation, Charlotte, NC (US)

(72) Inventor: John O'Neil, Litchfield, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/235,212

(22) Filed: Apr. 20, 2021

(51) Int. Cl.
*H02H 3/20* (2006.01)
*H03K 19/173* (2006.01)
*H02H 1/00* (2006.01)

(52) U.S. Cl.
CPC ............ *H02H 3/20* (2013.01); *H02H 1/0007* (2013.01); *H03K 19/173* (2013.01)

(58) Field of Classification Search
CPC ........... G05B 2219/15057; G05B 2219/34024; G05B 2219/34026; G05B 2219/37496; H01H 83/144; H01H 83/226; H02H 1/0007; H02H 3/08; H02H 3/20; H02H 7/04
See application file for complete search history.

(56) References Cited

U.S. PATENT DOCUMENTS

| 6,034,857 A * | 3/2000 | Sample ............ H03K 19/17744 361/93.2 |
| 7,977,936 B2 | 7/2011 | Lillestolen et al. |
| 9,140,755 B2 * | 9/2015 | Kuo ................. G01R 31/31924 |
| 9,214,802 B2 | 12/2015 | Harvey et al. |
| 2015/0280422 A1 * | 10/2015 | Harvey .................... H02H 3/08 361/35 |

* cited by examiner

*Primary Examiner* — Jared Fureman
*Assistant Examiner* — Nicolas Bellido
(74) *Attorney, Agent, or Firm* — Cantor Colburn LLP

(57) ABSTRACT

System and methods for partial RMS calculation of overcurrent in VDT driver circuits are provided. Aspects include sampling, by an FPGA, a set of current values from a sense resistor, wherein the sense resistor is coupled between a driver circuit and a VDT, determining, by the FPGA, an overcurrent event in the driver circuit based on the set of current values, wherein determining the overcurrent event in the driver circuit based on the set of current values includes trimming each current value to create a trimmed current value for each current value, calculating a square value for each trimmed current value and storing the square value in a buffer, calculating a mean for the square values, and determining the overcurrent event based on the mean being outside a predefined range of means, and disabling the driver circuit based on the determination of the overcurrent event.

18 Claims, 6 Drawing Sheets

_US 11,362,508 B1_

PARTIAL RMS BASED OVER-CURRENT DETECTION FOR VDT EXCITATION

BACKGROUND

The present invention generally relates to variable differential transformers (VDTs), and more specifically, to a partial root mean squared (RMS) over-current detection for VDT excitation.

The VDT is a type of electrical transformer used for measuring displacement (i.e., position) utilizing properties of an electrical transformer. An exemplary VDT is the linear variable differential transformer (LVDT) which, typically, includes three solenoidal coils placed end-to-end around a tube. The center coil is the primary winding, and the two outer coils are the top and bottom secondary windings. A cylindrical ferromagnetic core, attached to the object whose position is to be measured, slides along the axis of the tube. An alternating current (AC) excites or drives the primary winding and causes a voltage to be induced in each secondary winding proportional to the length of the core linking to the secondary winding.

LVDTs are used in applications such as, for example, power turbines, hydraulics, automation, aircraft, satellites, nuclear reactors, and the like. The LVDT converts a position or linear displacement from a mechanical reference (zero or null position) into a proportional electrical signal containing phase (for direction) and amplitude (for distance) information. The LVDT operation does not require an electrical contact between the moving part (probe or core assembly) and the coil assembly, but instead relies on electromagnetic coupling. VDTs are vulnerable to overcurrent events which can cause damage to the VDT components. Given the critical nature of these sensors in aircraft operations, there exists a need for improved methods for overcurrent detection.

BRIEF DESCRIPTION

Embodiments of the present invention are directed to a system. A non-limiting example of the system includes a driver circuit, a sense resistor coupled between the driver circuit and a variable differential transformer (VDT), a field programmable gate (FPGA) configured to sample a set of current values from the sense resistor, determine an overcurrent event in the driver circuit based on the set of current values, wherein determining the overcurrent event in the driver circuit based on the set of current values includes trimming each current value in the set of current values to create a trimmed current value for each current value in the set of current values, calculating a square value for each trimmed current value in the set of current values and storing the square value for each trimmed current value in a buffer, calculating a mean for the square values in the buffer, determining the overcurrent event based on the mean being outside a predefined range of means, and disable the driver circuit based on the determination of the overcurrent event.

Embodiments of the present invention are directed to a method. A non-limiting example of the method includes sampling, by an FPGA, a set of current values from a sense resistor, wherein the sense resistor is coupled between a driver circuit and a variable differential transformer (VDT), determining, by the FPGA, an overcurrent event in the driver circuit based on the set of current values, wherein determining the overcurrent event in the driver circuit based on the set of current values includes trimming each current value in the set of current values to create a trimmed current value for each current value in the set of current values, calculating a square value for each trimmed current value in the set of current values and storing the square value for each trimmed current value in a buffer, calculating a mean for the square values in the buffer, and determining the overcurrent event based on the mean being outside a predefined range of means, and disabling the driver circuit based on the determination of the overcurrent event.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of aircraft electric power systems to implement the various technical features described herein are well known. Accordingly, in the interest of brevity, many conventional implementation details are only mentioned briefly herein or are omitted entirely without providing the well-known system and/or process details.

Figure 1:
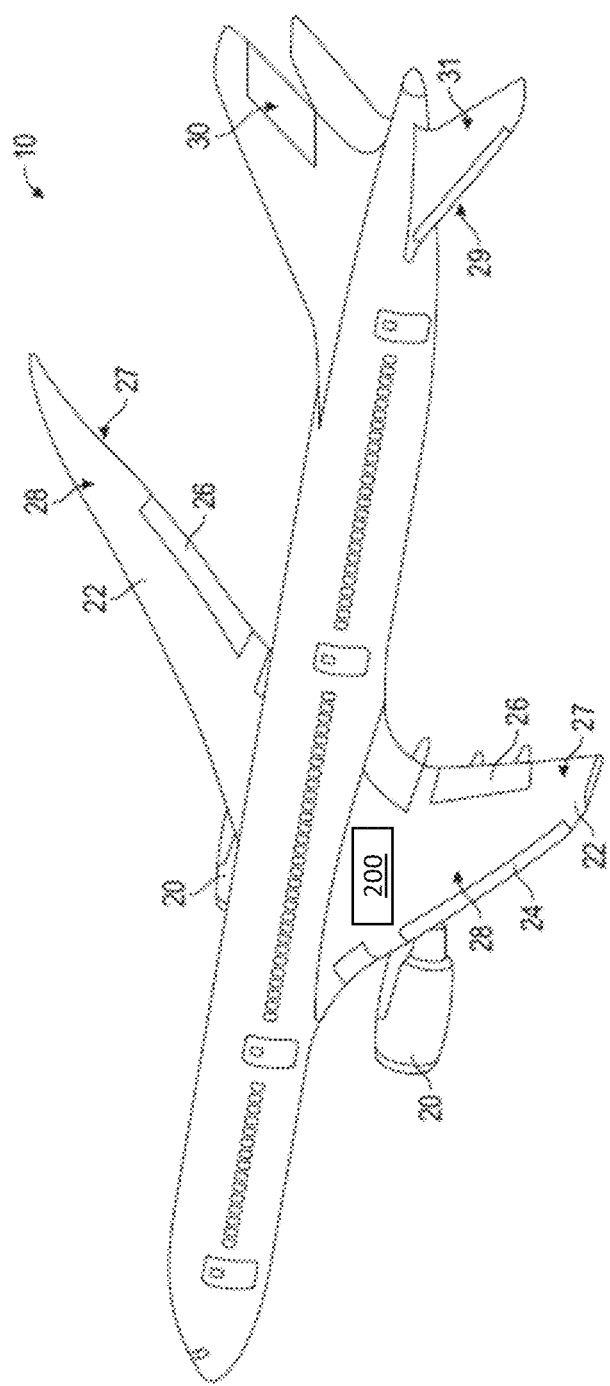
FIG. 1 is a perspective view of an aircraft that may incorporate embodiments of the present disclosure.

FIG. 1 illustrates an example of a commercial aircraft 10 having aircraft engines 20 that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. It will be understood that the slats 24 and/or the flaps 26 can include one or more slat/flap panels that move together. The aircraft 10 also includes a system 200 (described in greater detail in FIG. 2) which allows for partial RMS detection of overcurrent in VDT drivers according to one or more embodiments. VDTs can be utilized for sensing position related to slats 24 and/or the flaps 26 and also with a movable cowl of the nacelle surrounding the engine.

Turning now to an overview of technologies that are more specifically relevant to aspects of the disclosure, in most aerospace applications, VDT or voltage differential transformers are a common sensor which can take the form of a linear variable differential transformer (LVDT) or a rotary variable differential transformer (RVDT). An LVDT is a type of electrical transformer used for measuring linear displacement while the RVDT measures rotational displacement. The VDT measures position using a primary coil, two secondary coils, and a moveable core. The primary coil is excited by an AC source. In aerospace applications, the excitation is configured between 2 kHz and 8 kHz with a magnitude between 3 Vrms and 7 Vrms. VDTs as position sensors are typically managed by a vehicle management computer (VMC) where the measurements of this sensor provide control inputs for application such as, for example, a pilot pedal position and/or an actuator position. Due to the sensitivity of these positional sensors, the risks associated with overcurrent require the use of overcurrent sense circuitry and feedback circuitry. This overcurrent sense circuitry requires bulky components that require power and space on the circuit boards within the aircraft.

Turning now to an overview of the aspects of the disclosure, one or more embodiments address the above-described problem by providing systems and methods for sensing overcurrent in a VDT excitation driver by moving the overcurrent sensing function into a field programmable gate array (FPGA) and removing the overcurrent sense and feedback circuitry from the driver. This has the benefit of removing the bulky components with high power consumption needs that are found in typical overcurrent and feedback sense circuitry in current VDT excitation driver topologies. The FPGA can be utilized to determine the presence of an overcurrent in the VDT excitation driver and also provide a shutoff signal through an enable input to the VDT excitation drivers should the driver need to be shut off to protect from potential damage due to overcurrent.

Figure 2:
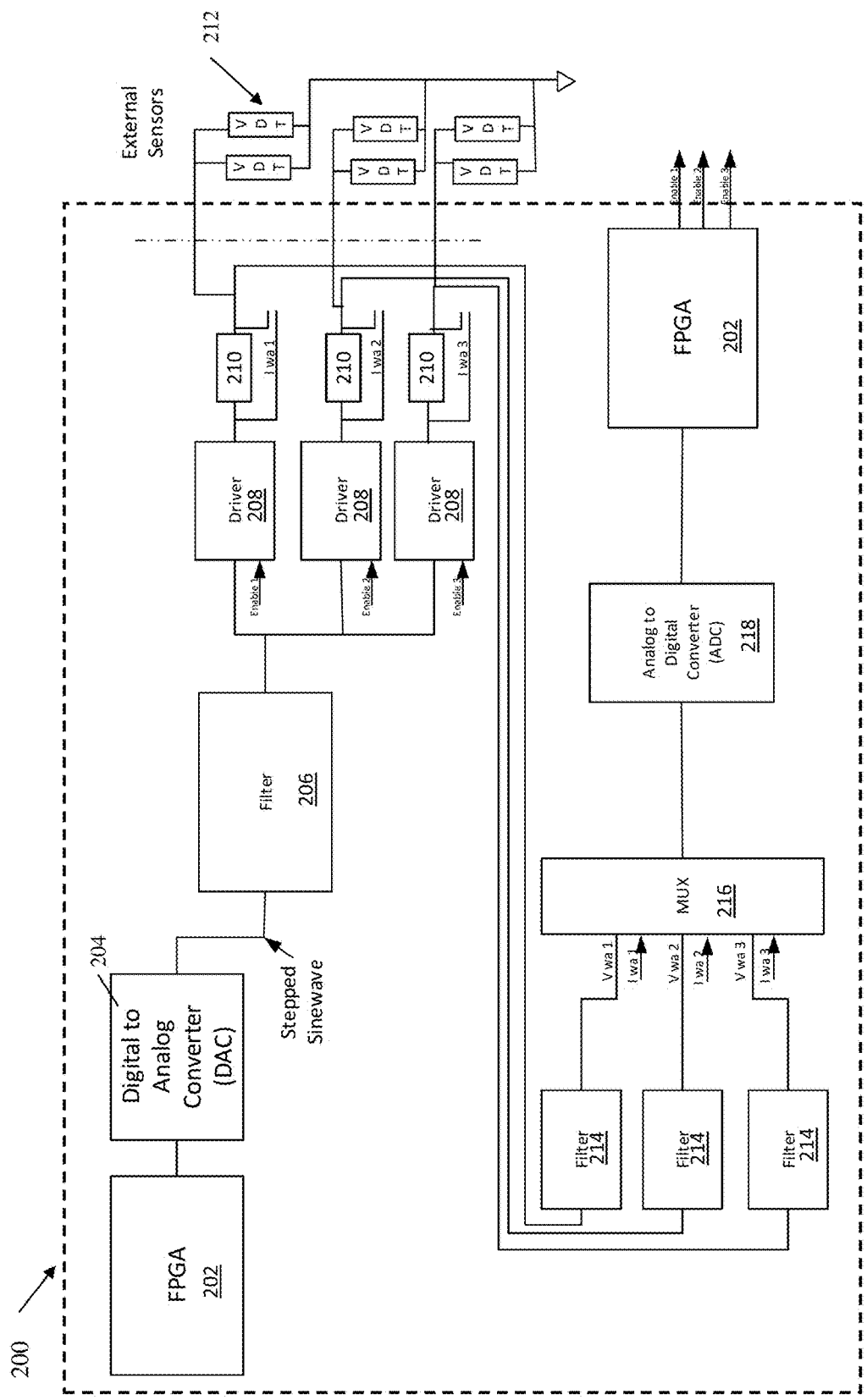
FIG. 2 depicts a block diagram of a VDT excitation driver with overcurrent sensing through an FPGA according to one or more embodiments.

FIG. 2 depicts a block diagram of a VDT excitation driver with overcurrent sensing through an FPGA according to one or more embodiments. The VDT excitation driver 200 provides an alternating current to a set of VDTs 212 through the driver circuits 208. The driver circuits 208 are controlled by an FPGA 202 which passes a command signal to the driver circuits 208 through a digital to analog converter 204 and a filter 206. The FPGA 202 also controls the enable (Enable 1, Enable 2, Enable 3) for each driver circuit 208. The VDT excitation driver 200 also includes a sense resistor 210 between the driver circuits 208 and the set of VDTs 212. In one or more embodiments, the voltage and current across the sense resistor 210 is sampled by the FPGA 202 for analysis and determination of an overcurrent event and/or overvoltage event in the driver circuits 208. The sampled signals are filtered through filters 214 and then fed through a 3:1 multiplexer 216 to interleave the sampled currents, sampled voltages and multiplexer Built In Test (BIT) signals. These interleaved sampled currents and sampled voltages are fed through an analog to digital converter (ADC) 218 before being received by the FPGA 202. The analysis performed by the FPGA 202 is discussed in more detail below with reference to FIGS. 4a and 4b.

Figure 3:
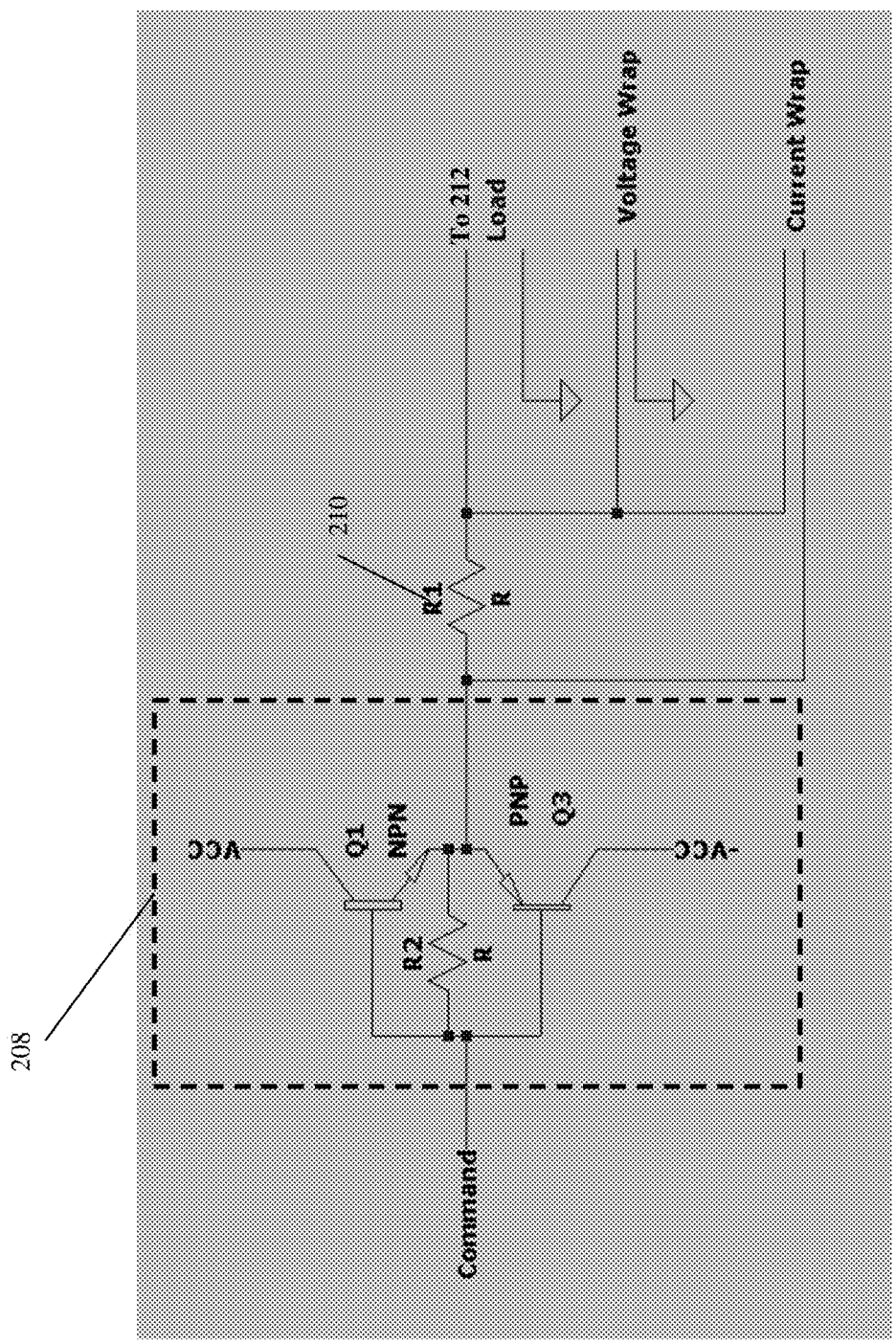
FIG. 3 depicts a circuit diagram of a driver circuit according to one or more embodiments.

FIG. 3 depicts a circuit diagram of a driver circuit according to one or more embodiments. The driver circuit 208 includes two switches Q1 and Q3. In one or more embodiments, the two switches Q1, Q3 are bipolar junction transistors (BJTs). The collector of the first BJT Q1 is connected to the positive IC power supply Vcc and the emitter of the first BJT Q1 is connected to the collector of the second BJT Q3. The emitter of the second BJT Q3 is connected to the negative IC power supply—Vcc. Responsive to a command signal from the FPGA 202 (from FIG. 2), the driver circuit 208 provides an AC current to the set of VDTs 212 (from FIG. 2) by pulling from either the positive or negative IC power supply lines. The sense resistor 210 can be any type of resistor such as, for example, a 10 ohm resistor. The voltage wraparound and current wraparound provide a voltage and current feedback, respectively, to the FPGA 202 (from FIG. 2).

Figure 4A:
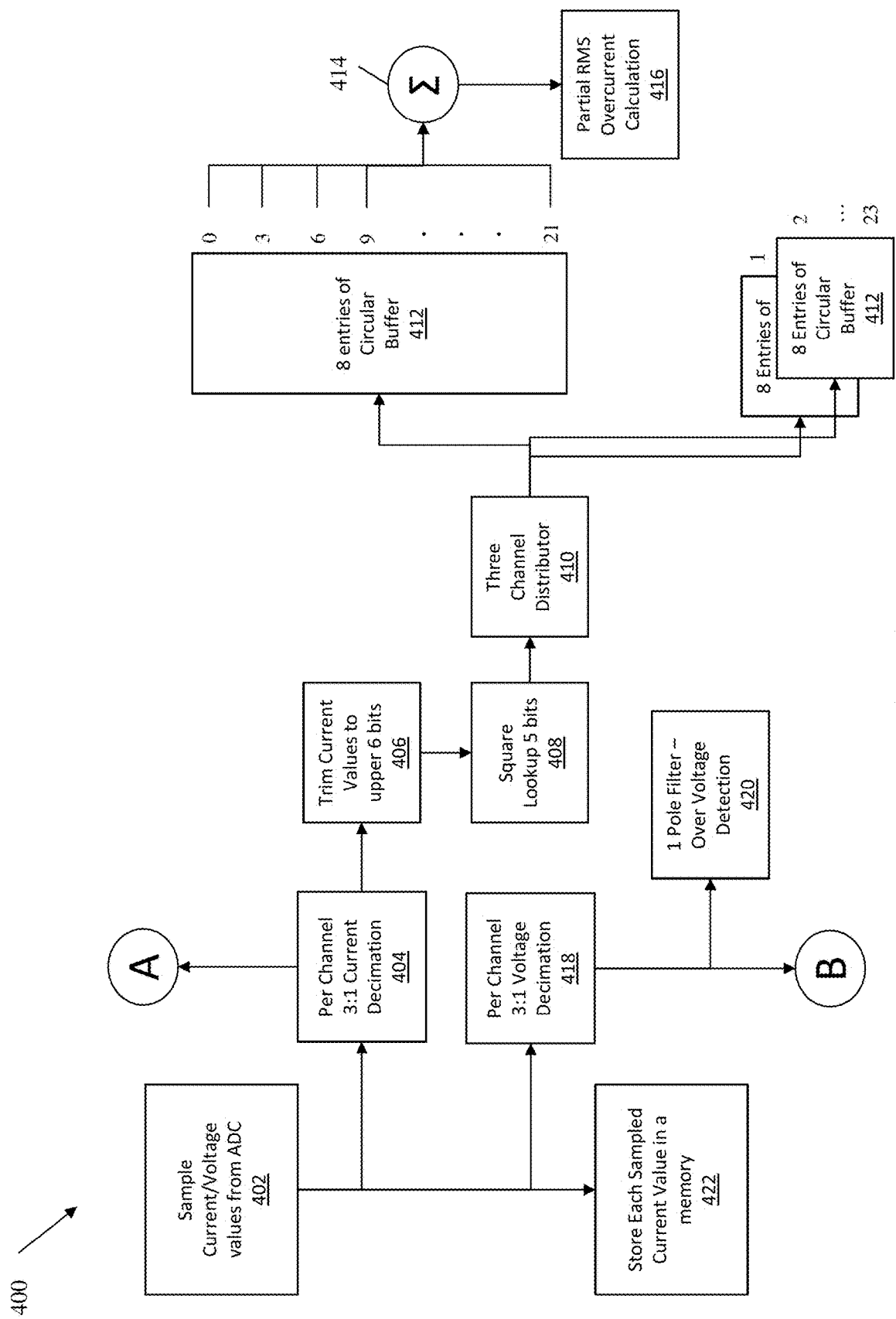
FIG. 4a depicts a flow diagram of a method for determining an overcurrent event and/or an overvoltage event in a VDT driver circuit according to one or more embodiments.

FIG. 4a depicts a flow diagram of a method for determining an overcurrent event and/or an overvoltage event in a VDT driver circuit according to one or more embodiments. The flow diagram 400a includes a set of process blocks that can be performed by the FPGA 202 (from FIG. 2). The method 400a includes the FPGA 202 sampling both current and voltage values from the ADC 218, as shown in block 402. In some embodiments, the ADC 218 is an 18 bit ADC. The sampled current and voltage values are taken from the sense resistors 210 from each driver circuit 208. In the illustrated example in FIG. 2, there are three driver circuits 208 but any number of driver circuits 208 can be utilized and the voltage/current values sampled can be performed at any sampling rate. At block 404 of the method 400a, the FPGA 202 decimates the sampled values, retaining the current samples and rejecting the voltage and BIT samples (which are routed to other processing blocks). At process block 406, the method 400a continues by having the FPGA 202 truncate or trim the 16 bits from the ADC 218 to 6 bits allowing for a reduced FPGA processing, while maintaining acceptable resolution (i.e., 0.32V/10 ohm or 3.2 mA) for the overcurrent function. The square of a 6 bit signed value produces a 10 bit value, compared to the square of a 16 bit value which results in a 30 bit value, the reduction in processing is apparent. Next, at block 408, the method 400a continues with the FPGA 202 squaring the 5 bits with the $6^{th}$ bit being the sign bit. The squaring is performed by comparing the 5 bits with a lookup table to determine the square of the bits. Here, a lookup table is used to save on processing time by the FPGA 202. The method 400a, at block 410, continues with the FPGA 202 storing the square values in a circular buffer over three periods of excitation. These three circular buffers 412 store these square values which are then summed, as shown at block 414. The method 400a, at block 416, continues with the FPGA 202 analyzing a partial RMS value. The partial RMS value is the mean squared value where the summed square values are divided by 8 to get the mean of the square values from the buffer. This mean of the square values is compared to a predefined range of means to determine whether this mean squared value is outside of the predefined range. If the mean squared value is outside of the predefined range, then an overcurrent event exists and the driver can be disabled by the FPGA 202 by providing a logic low to the enable input of the affected driver circuit. This process of summing the square values and calculating the mean of the squared values is performed for each circular buffer which stores squared values for three total cycles (24 square values). The three cycles are chosen based on an 8 KHz excitation frequency, where 3 cycles cover 375 µs which would reject indications due to the 120 µs duration of a DO-160, Environmental Conditions and Test Procedures for Airborne Equipment Waveform 5a. lightning strike. The Mean-Square values are available to the software for verification (Production test) and for Application tests for detection/isolation of open circuit faults of parallel sensors. The threshold value would be set to 8× Mean Square value to protect the components. In some embodiments, to protect a 10 ohm 14 W resistor (the sense resistor), the voltage is limited to 2 volts ($2V^2/10$ ohm=0.4 W). The ADC 218 is a +/−10V range, using the 6 bits, one of which is the sign. The threshold is $0.4 W*10 ohm*8*(32 counts/10V)^2$ or 328 counts. The value of 328 is the equivalent threshold of 0.4004 W, while the value of 329 I the equivalent threshold of 0.4016 W, showing a resolution of 0.0012 W, justifying the reduction of significant bits.

In one or more embodiments, the method 400a, at block 418, includes the FPGA 202 decimating the samples, retaining the current samples. At block 420, the method 400a continues with the FPGA 202 analyzing the voltage samples after being fed through a 1 pole filter.

In one or more embodiments, the 1 pole filter reduces the sampled voltage by ⅛ for analysis by the FGPA 202. The filtered values of the voltage samples can be compared to a predefined voltage threshold value and if the reduced value exceeds the voltage threshold, an overvoltage event exists and the driver circuit 208 can be disabled. The single pole filter, implemented in the FPGA 202, where $Y_n=Y_{n-1}+(X-Y_{n-1})/8$ provides attenuation of 0.056 at the excitation frequency. This results in a 10V peak excitation to have a peak of 0.56V after the filter. The FPGA 202 can compare the filtered value to 1.28 V(0001,0000,0000, 0000b), only the four most significant bits need be compared to detect a "short to Power" failure. The margin between the expected peak and the fault level allows for offsets and noise to reduce false, annoyance trips. In one or more embodiments, the pre-processed sampled current and voltage values are being stored in a memory for later analysis, as shown in block 422.

Figure 4B:
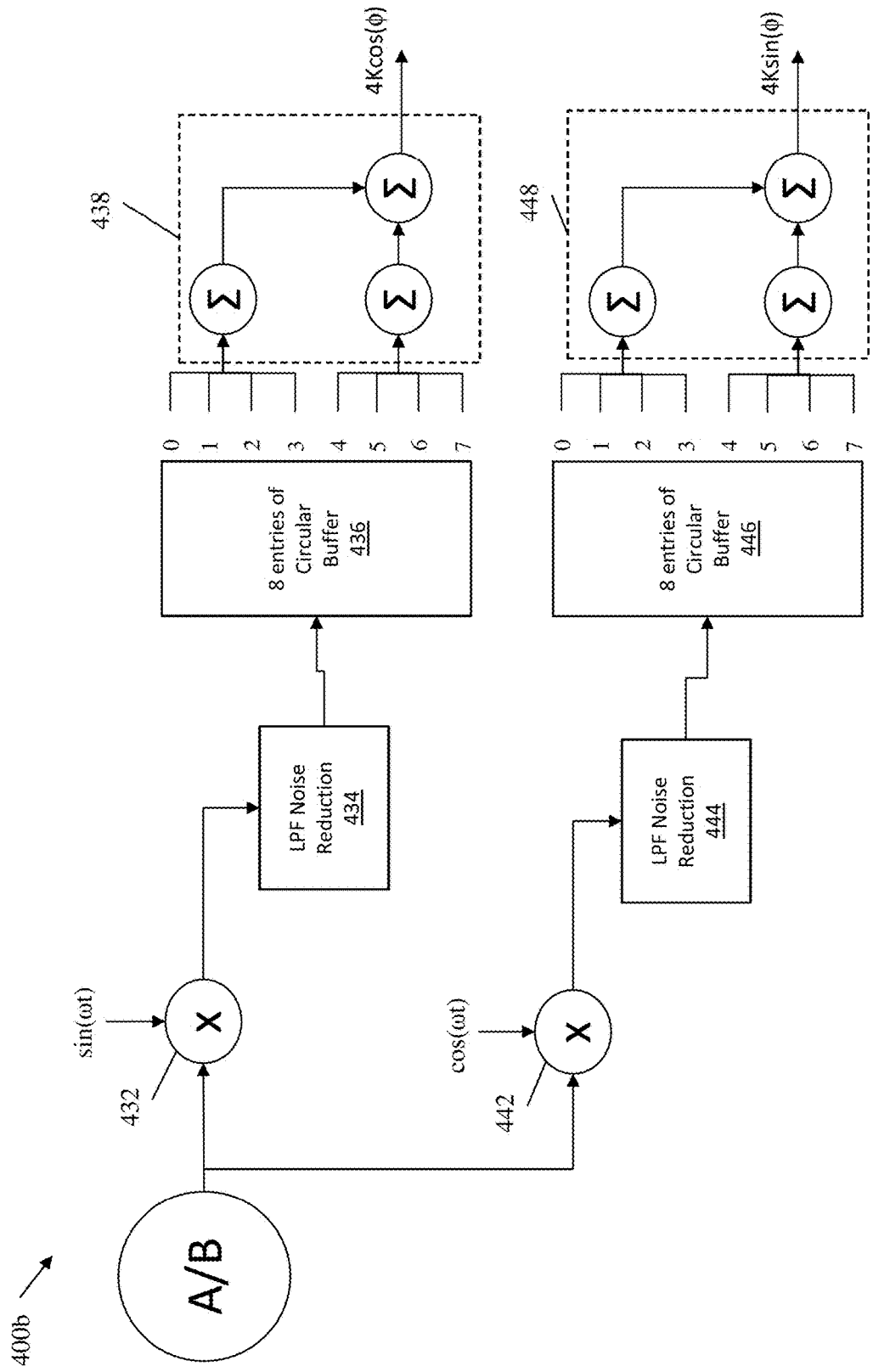
FIG. 4b depicts a flow diagram of a method for determining voltage and current magnitude according to one or more embodiments.

In one or more embodiments, the 3:1 decimation is performed on both the sampled current and sampled voltage values at block 404 and 418. These decimated samples are further analyzed at blocks A and B and is described in greater detail in FIG. 4b. FIG. 4b depicts a flow diagram of a method for determining voltage and current magnitude according to one or more embodiments. The method 400b starts with the sampled current and voltage values from the ADC 218 shown from blocks A and B. The method 400b, at block 432, includes the FPGA 202 multiplying the sampled value by a sine function. In one or more embodiments, the sine function is sin(ωt) where ω is excitation frequency. The method 400b continues by passing the multiplied current signal through a low pass filter, shown in block 434. The low pass filter reduces noise beyond 0.122 times excitation frequency. For a 3000 Hz excitation frequency, a 60 Hz noise is modulated to 2940 Hz and 2060 Hz. The 366 Hz (0.122×3000 Hz) filter attenuates the 2940 Hz noise by a factor of 0.124. The filter signals are stored in a circular buffer 436 and summed 438 using rectangular filters (moving average) to remove harmonics of the excitation frequency including 0 Hz. The rectangular filters also attenuate the 60 Hz contribution by another factor of 0.1. The method 400b includes similar processing of the sampled voltage values except the sampled signals are multiplied 442 by a cosine function. In one or more embodiments, the cosine function is cos(ωt) where ω is excitation frequency. A similar low pass filtering occurs 444 with the multiplied voltage signals which are then stored in a circular buffer 446 and summed 448 using rectangular filters to remove harmonics of the excitation frequency. The results of the summing 438, 448 are Sine and Cosine components of the phase offset of the input (excitation) from the demodulation times the magnitude of the input (excitation). These components can be analyzed for improved fault detection and isolation.

The Excitation signal (ADC input) is K sin(ωt+φ), where K is the magnitude, ω is excitation frequency, t is time, and φ is the phase offset from the demodulation signal. Using the trigonometric the following identities:

$$Sin(x)sin(y)=\tfrac{1}{2}[cos(x-y)-cos(x+y)]$$

$$Sin(x)cos(y)=\tfrac{1}{2}[sin(x+y)+sin(x-y)]$$

The processing steps for the upper path, where x is (ωt+φ), and y is (ωt), results in (x+y)=(2ωt+φ), and (x−y)=(φ), results in:

$$K\,Sin(\omega t+\phi)sin(\omega t)=\tfrac{1}{2}K[cos(\phi)-cos(2\omega t+\phi)]$$

The sum of eight products, over a cycle by the rectangular filter removes the second harmonic reducing the output to: 4K [cos(φ)]

Similarly, the Sin(x)cos(y) path produces: 4K [sin(φ)]

The four values are available to the software for further processing. (sin and cos for voltage, and sin and cos for current).

The software calculates the magnitudes for the voltage and current by: $K=SQRT[\{4K[sin(\phi)]\}^2+(4K\,[cos(\phi)])^2]/4$ The software (e.g., the FPGA 202) calculates the phase for the voltage and current by: φ=ArcTangent [{4K[sin(φ)]}/(4K [cos(φ)])]

These four factors, Voltage magnitude and phase, along with current magnitude and phase may be used to calculate the impedance (R/L) of the sensor and monitor it for aging effects, since actuator position sensors may be located in harsh environments, such as on-wing (<30C) or transmission/engine compartments (>200C).

Figure 5:
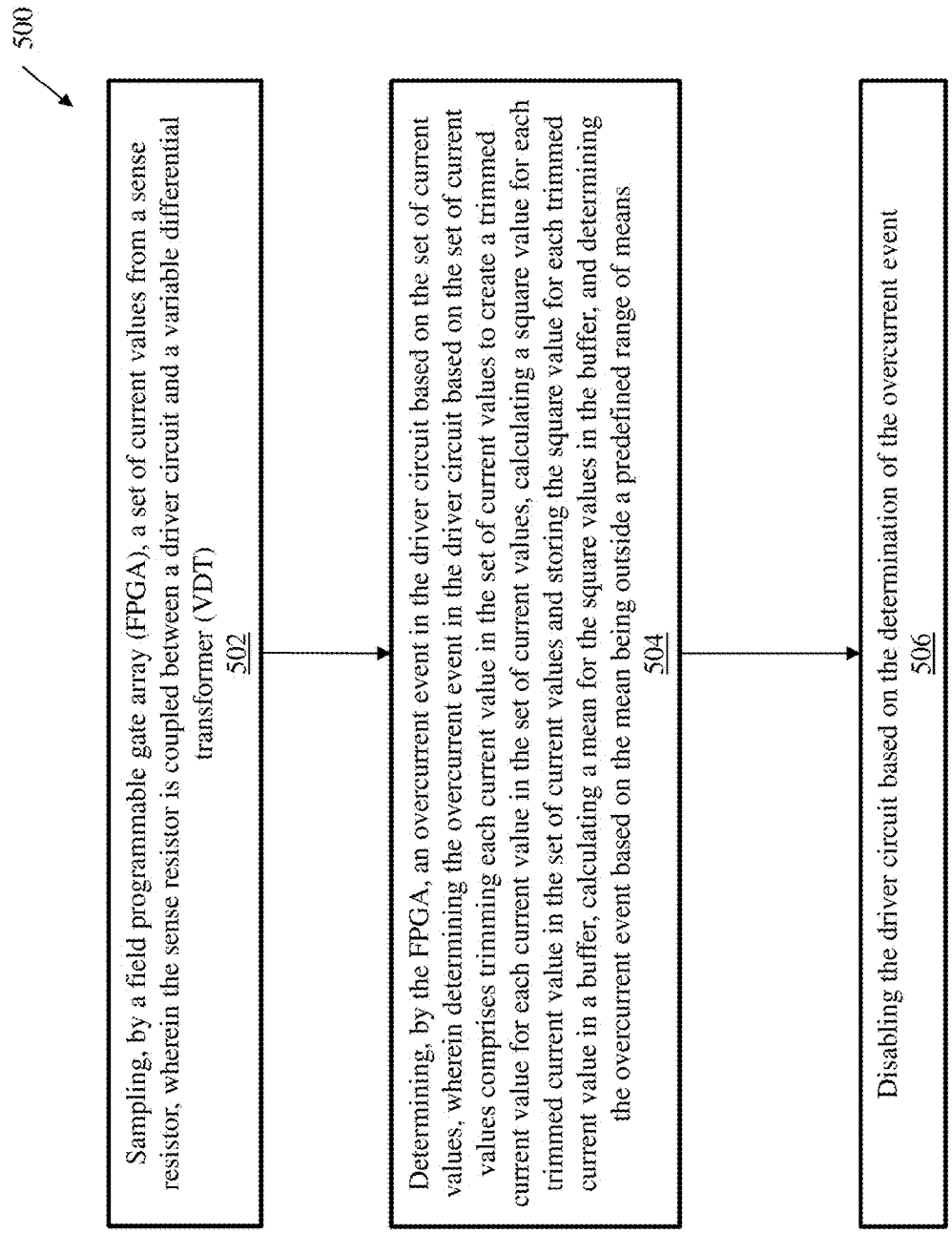
FIG. 5 depicts a flow diagram of a method for partial RMS calculation for determining overcurrent in VDT driver circuits according to one or more embodiments.

FIG. 5 depicts a flow diagram of a method for partial RMS calculation for determining overcurrent in VDT driver circuits according to one or more embodiments. The method 500 includes sampling, by a field programmable gate array (FPGA), a set of current values from a sense resistor, wherein the sense resistor is coupled between a driver circuit and a variable differential transformer (VDT), as shown in block 502. The sample rate can be eight times the excitation frequency which sets the rate of sampling of the current and voltage values that are interleaved through the multiplexer 216 (from FIG. 2). The method 500, at block 504, also includes determining, by the FPGA, an overcurrent event in the driver circuit based on the set of current values. Determining the overcurrent event in the driver circuit based on the set of current values includes trimming each current value in the set of current values to create a trimmed current value for each current value in the set of current values, calculating a square value for each trimmed current value in the set of current values and storing the square value for each trimmed current value in a buffer, calculating a mean for the square values in the buffer, and determining the overcurrent event based on the mean being outside a predefined range of means. And at block 506, the method 500 includes disabling the driver circuit based on the determination of the overcurrent event.

Additional processes may also be included. It should be understood that the processes depicted in FIG. 5 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
    a driver circuit;
    a sense resistor coupled between the driver circuit and a variable differential transformer (VDT); and
    a field programmable gate array (FPGA) configured to:
        sample a set of current values from the sense resistor;
        determine an overcurrent event in the driver circuit based on the set of current values, wherein determining the overcurrent event in the driver circuit based on the set of current values comprises:
            trimming each current value in the set of current values to create a trimmed current value for each current value in the set of current values;
            calculating a square value for each trimmed current value in the set of current values and storing the square value for each trimmed current value in a buffer;
            calculating a mean for the square values in the buffer;
            determining the overcurrent event based on the mean being outside a predefined range of means; and
        disable the driver circuit based on the determination of the overcurrent event.

2. The system of claim 1, wherein the FPGA is further configured to:
    sample a set of voltage values from the sense resistor;
    determine an overvoltage event in the driver circuit based on the set of voltage values; and
    disable the driver circuit based on the determination of the overvoltage event.

3. The system of claim 2, wherein determining an overvoltage event in the driver circuit based on the set of voltage values comprises:
    filtering each voltage value in the set of voltage values into a reduced voltage value;
    determining the overvoltage event based on the reduced voltage value exceeding a predefined threshold voltage value.

4. The system of claim 1, wherein the buffer comprises a circular buffer.

5. The system of claim 1, wherein the VDT comprises one or more linear variable differential transformers.

6. The system of claim 1, wherein the VDT comprises rotary variable differential transformers.

7. The system of claim 1, wherein the driver circuit comprises:
    a first switch, wherein the first switch is a bipolar junction transistor having a first emitter terminal, a first collector terminal, and a first base terminal;
    a second switch, wherein the second switch is a bipolar junction transistor having a second emitter terminal, a second collector terminal, and a second base terminal; and
    wherein the first base terminal and second base terminal are connected to an output of the FPGA.

8. The system of claim 7, wherein the sense resistor is connected to the first emitter terminal.

9. The system of claim 1, wherein the driver circuit comprises an enable input; and
   wherein disabling the driver circuit comprises providing a logic low signal to the enable input of the driver circuit.

10. A method comprising:
   sampling, by a field programmable gate array (FPGA), a set of current values from a sense resistor, wherein the sense resistor is coupled between a driver circuit and a variable differential transformer (VDT);
   determining, by the FPGA, an overcurrent event in the driver circuit based on the set of current values, wherein determining the overcurrent event in the driver circuit based on the set of current values comprises:
      trimming each current value in the set of current values to create a trimmed current value for each current value in the set of current values;
      calculating a square value for each trimmed current value in the set of current values and storing the square value for each trimmed current value in a buffer;
      calculating a mean for the square values in the buffer;
      determining the overcurrent event based on the mean being outside a predefined range of means; and
      disabling the driver circuit based on the determination of the overcurrent event.

11. The method of claim 10, further comprising:
   sampling a set of voltage values from the sense resistor;
   determining an overvoltage event in the driver circuit based on the set of voltage values; and
   disabling the driver circuit based on the determination of the overvoltage event.

12. The method of claim 11, wherein determining an overvoltage event in the driver circuit based on the set of voltage values comprises:
   filtering each voltage value in the set of voltage values into a reduced voltage value;
   determining the overvoltage event based on the reduced voltage value exceeding a predefined threshold voltage value.

13. The method of claim 10, wherein the buffer comprises a circular buffer.

14. The method of claim 10, wherein the VDT comprises one or more linear variable differential transformers.

15. The method of claim 10, wherein the VDT comprises rotary variable differential transformers.

16. The method of claim 10, wherein the driver circuit comprises:
   a first switch, wherein the first switch is a bipolar junction transistor having a first emitter terminal, a first collector terminal, and a first base terminal;
   a second switch, wherein the second switch is a bipolar junction transistor having a second emitter terminal, a second collector terminal, and a second base terminal; and
   wherein the first base terminal and second base terminal are connected to an output of the FPGA.

17. The method of claim 16, wherein the sense resistor is connected to the first emitter terminal.

18. The method of claim 10, wherein the driver circuit comprises an enable input; and
   wherein disabling the driver circuit comprises providing a logic low signal to the enable input of the driver circuit.

* * * * *